United States Patent [19]
White

[11] Patent Number: 4,809,209
[45] Date of Patent: Feb. 28, 1989

[54] MYBRID CHARGE-TRANSFER-DEVICE FILTER STRUCTURE

[75] Inventor: Stanley A. White, Orange, Calif.

[73] Assignee: Rockwell International Corporation, El Segundo, Calif.

[21] Appl. No.: 769,059

[22] Filed: Aug. 26, 1985

[51] Int. Cl.[4] .............................................. G06F 15/31
[52] U.S. Cl. ............................ 364/724.16; 364/724.03
[58] Field of Search ......................................... 364/724

[56] References Cited

U.S. PATENT DOCUMENTS

| | | | |
|---|---|---|---|
| 3,676,654 | 7/1972 | Melvin | 364/724 |
| 4,149,259 | 4/1979 | Kowalski | 364/724 |
| 4,495,591 | 1/1985 | Loomis, Jr. | 364/724 |
| 4,507,725 | 3/1985 | Christopher et al. | 364/724 |
| 4,524,423 | 6/1985 | Acampora | 364/724 |
| 4,542,475 | 9/1985 | Acampora | 364/724 |
| 4,611,305 | 9/1986 | Iwase | 364/724 |
| 4,641,259 | 2/1987 | Shan et al. | 364/724 |
| 4,644,488 | 2/1987 | Nathan | 364/724 |
| 4,691,292 | 9/1987 | Rothweiler | 364/724 |
| 4,691,293 | 9/1987 | Conboy | 364/724 |
| 4,701,874 | 10/1987 | Akai et al. | 364/724 |

Primary Examiner—Gary V. Harkcom
Assistant Examiner—Dale M. Shaw
Attorney, Agent, or Firm—H. Fredrick Hamann; George A. Montanye; James F. Kirk

[57] ABSTRACT

A signal processor suitable for use as a discrete-time or sampled-data analog filter can be implemented by using only a few of the coefficient multipliers of a typical analog finite-impulse-response (FIR) filter, and expressing each coefficient multiplier as a multibit digital word. Each bit of the multibit word is formulated as a tap weight coupled to a delay element of an input-delay line. Factor elements are coupled to the outputs of the bit-tap-weights to multiply the outputs of those bit-tap-weights by factors representative of the significance of the bit represented by that weight. Bit-tap weight outputs from tabs that were lens delayed on the input line are delayed upon output so the outputs of all the bit-tap weights associated with a single multibit word are combined together to form a single output. The output signal is interpolated in an interpolator to recover the information lost by omitting some of the coefficient multipliers.

10 Claims, 6 Drawing Sheets

MYBRID CHARGE-TRANSFER-DEVICE FILTER STRUCTURE

BACKGROUND OF THE INVENTION

The present invention relates to discrete-time analog filters, also called sampled-data filters. The invention particularly relates to those filters intended for use with signals having frequencies or sampling rates in the range of several hundred megahertz to a few gigahertz.

A sampled-data filter may be formed of charge-transfer devices, such as charge-coupled devices. One such filter is a bandpass filter. For many applications, the sampling frequency for the signal input to such a filter may be very high, on the order of several hundred megahertz to a few gigahertz. A typical bandpass filter must meet specifications for a number of performance criteria, including passband width, transition width, and stopband rejection. If the filter is an "agile" bandpass filter for which the filter characteristics are changeable, additional performance criteria such as the speed with which changes are effected are also specified. Typically, changes in filter characteristics must be accomplished quickly, within a few cycles of the sampling frequency.

Discrete-time filters have typically been implemented using conventional analog finite-impulse-response (FIR) filters having analog coefficient multipliers, as shown in FIG. 1. A conventional analog FIR filter has an input delay line 10 with a plurality of taps 12, each having a tap weight. Each tap weight is an analog value to be multiplied by the signal tapped from the input delay line. The outputs of the taps 12 are combined in a summer 14 to form the output from the filter. Experience has shown, however, that the tolerance of each analog tap-weight value is difficult to control. Thus, the filter may not be accurately repeatable or reproducible. Further, when the sampling frequency is high, on the order of several hundred megahertz to a few gigahertz, it has been found that it is difficult to multiply the incoming high-frequency signal by these analog-coefficient multipliers and obtain accurate results because of the difficulties of high-speed multiplication. In addition, for an "agile filter", it is difficult to change the analog coefficients of the tap weights quickly, and maintain sufficient accuracy in those coefficients and the multiplication process.

In an attempt to improve somewhat on the performance of the conventional analog finite-impulse-response filter, the use of digital tap weights in association with each tap has been suggested. One accurate method to digitally implement the tap weights is by multiplying digital-to-analog converters; however, this method is restricted to low sampling-rate frequencies.

A structure for digitally implementing the tap weights for higher-speed operation is shown in FIG. 2. In such a finite-impulse-response filter, several binary-analog correlators (BAC's) 20 are connected in parallel. Each BAC 20 is a separate finite-impulse-response filter in which the coefficient multipliers in each tap 22 are the corresponding bits of the several filter coefficients when expressed as binary numbers. Each bit of each filter coefficient is mechanized using one BAC 20. As many BAC's are used as there are bits in each binary filter coefficient. The first BAC filter 20a uses for its tap weights or coefficient multipliers only the most-significant bit of each coefficient. The second filter 20b uses for its tap weights only the second-most-significant bit of each coefficient, and so on. As many of these binary-analog correlators are connected in parallel as there are bits in the multiplier coefficients. The output of each correlator is weighted appropriately in a weighting element 24 to correspond to the significance of the bit of that correlator in the coefficient multipliers. The weighted outputs are then summed in an output summer 26 to obtain the desired filter output.

Each tap multiplier 22 in the BAC filter therefore has a binary-coefficient, resulting in a known accuracy of multiplication for high-frequency signals; but, since the filter requires as many separate binary-analog correlators 20 as there are bits specified in the coefficient multipliers of the filter, these filters generally occupy too much circuit space, consume too much power, are too expensive for most practical systems. In addition, the large number of individual binary-coefficient multipliers, each with its own reliability and tolerance characteristics, may reduce overall system reliability.

In addition, each of the numerous delay elements in each BAC forming the filter has its own charge-transfer inefficiency, further contributing to the performance error for the overall filter. For example, a sampled-data filter may be designed for operation at a sample frequency of 870 MHz, with a 3 MHz passband width, a 95 DB stopband rejection, a transition frequency of 6 MHz, and intended to change frequencies in 6.7 nanoseconds. If each tap weight is approximated as a fourteen-bit binary number, with one GaAs cell representing each bit, that filter may be implemented with a gallium arsenide CCD-filter design with approximately 400 taps, if the charge-transfer-inefficiency variance is kept sufficiently small to keep the accuracy of the filter within acceptable limits. With N=400 taps, B=14 bits/tap, and 1 cell/bit, N times B=5600 cells are required to implement the filter. To keep the overall operation of the filter within any kind of acceptable limits, the variation in the charge-transfer inefficiencies of the cells must be kept to less than approximately $10^{-6}$. The yield of devices that meet such performance specifications is small, causing such filters to be prohibitively expensive.

For filtering signals having low sampling frequencies, such as speech, some work has been done on decimated or thinned analog and digital finite-impulse-response filters. These thinned filters have a greatly reduced number of weighting coefficients. An example of a thinned analog filter is shown in FIG. 3. This reduction in the number of filter coefficients is possible because FIR filter tap weights are generally, from an information-theoretic point of view, overspecified. Coefficient values may be removed from the filters, thereby making the corresponding points on the impulse-response curve zero. By interpolation, however, these missing points may be recovered with suitable accuracy. The filter formed by a thinned FIR filter with an interpolator coupled to the output may be viewed as a pair of filters, with the thinned filter connected in tandem with the interpolator. Papers discussing thinned FIR filters are:

1. M. W. Smith and D. C. Farden, "Thinning The Impulse Response of FIR Digital Filters", *Proc. ICASSP* 81; Mar. 30, 31, Apr 1, 1981; Atlanta, Ga., pp 240–242.

2. G. F. Boudreaux and T. W. Parks, "Thinning Digital Filters: A Piecewise-Exponential Approximation Approach", *IEEE Trans., Vol.* ASSSP-31, No. 1, Feb. 1983, pp. 105–113.

3. M. V. Thomas, Y. Neuvo, and S. K. Mitra, "Two-Dimensional Interpolated FIR Filters", *Proc. ISCAS* 83, May 2-4, 1983; Newport Beach, CA, pp. 904-906.

4. Y. Neuvo, D. Cheng-yu, and S. K. Mitra; "Interpolated Finite Impulse Response Filters", *IEEE Trans. Acoustics, Speech, and Signal Processing*, Vol. ASSP-32, No. 3; June 1984, pp. 563-570.

Different studies have suggested that, in most instances, one may omit from a finite-impulse-response filter having multiple coefficient multipliers one out of two coefficients, three out of four coefficients, or seven out of eight coefficients. Interpolation of the filter output restores the signal. Nevertheless, the same number of delay elements on the input delay line for the filter is necessary so the tap coefficients that remain in the filter properly operate on the input signal and combine in the summer at the proper time.

Each tap weight or coefficient multiplier 32 of the thinned filter is an analog value, as in the conventional analog FIR filter. Such analog multipliers are acceptable for low-frequency signals, such as voice, but are inappropriate for high-frequency signals in the gigahertz range because of the difficulty in accurate multiplication, as discussed above. Thus, these decimated or thinned filters have been used in telephone and other low-frequency systems; but, the problems of multiplying the input signals by the analog coefficients accurately enough and fast enough for high-frequency sampled-data signals such as are used in high-frequency communication systems have prevented their use there. In addition, the problems associated with rapid changes of the filter coefficients in agile filters remain in the thinned or decimated filter.

SUMMARY OF THE INVENTION

The present invention is a signal processor useful with high-frequency signals, such as high-frequency sampled-data signals, for filtering those signals accurately, and providing the capability of changing the filter coefficients or characteristics quickly and with accuracy.

The invention is a hybrid charge-transfer-device filter including a thinned finite-impulse-response filter in which each filter coefficient of a thinned filter is expressed or approximated as a multibit digital word. Each bit of this multibit digital word forms a tap weight on a tap from the input delay line of the filter. The output of each tap weight is scaled by a value corresponding to the significance of that tap weight bit in the multibit word, and is delayed so the outputs of the taps forming a single word are combined together to form the filter output.

The signal processor of the invention includes a delay line having a plurality of delay elements. The signal processor further includes bit-tap elements, each having an input coupled to one of the delay elements to multiply the tap-element input by a single bit of a multibit word comprising a filter coefficient of a thinned FIR filter. The signal processor further includes a summer for combining the outputs of the bit-tap elements, and a plurality of delay elements coupled to the outputs of at least some of the bit-tap elements to delay those outputs so the outputs of the bit-tap elements forming a single filter coefficient are combined together in the summer into a single processor output.

DETAILED DESCRIPTION OF THE PREFERRED EMBODIMENT

Figure 3:
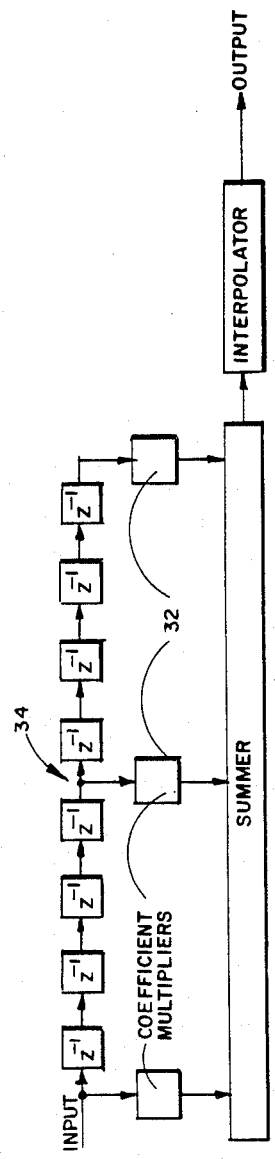
FIG. 3 is a schematic diagram of a thinned finite-impulse-response filter.

In an analog thinned or decimated FIR filter such as that shown in FIG. 3, only a few of the tap locations on the input delay line 34 are used. In the signal processor of the present invention, a thinned finite-impulse-response discrete-time analog filter has each of its filter coefficients expressed as a multibit digital word. Each bit is implemented as a bit-tap weight coupled to an input delay line at the locations liberated by the thinning of the analog filter to produce a hybrid charge-transfer device filter structure. This hybrid filter takes analog input data, and applies digital-filter coefficients to that data. Such a hybrid filter is both more accurate and easier to manufacture than a conventional variable analog-tap-weighted FIR CCD filter.

The hybrid filter of the invention preferably includes an input delay line having on it a plurality of delay elements. In the embodiment of the present invention shown in FIG. 4, the delay line 40 has seven delay elements 42. The representation shown is for illustration only. As will be apparent to those skilled in the art, a typical high-performance, high-frequency signal filter will have significantly more delay elements and potential tap locations, perhaps up to several hundred. Nevertheless, the principles of the present invention may be applied to a filter of any size.

In the filter of the invention a plurality of binary tap weights or binary-coefficient multipliers 44 are coupled to taps on the input delay line 40. Together these binary-coefficient multipliers form the coefficient multipliers of a thinned or decimated finite-impulse-response filter in which only certain of the coefficient multipliers of a conventional FIR filter are used. The thinned-filter coefficients are determined using known thinned or decimated analog finite-impulse-response filter techniques.

Each analog filter coefficient of the thinned filter is expressed in binary form as a multibit word. In the embodiment shown in FIG. 4, each filter-coefficient multiplier is expressed as four-bit word. Nevertheless, the number of bits used to express each coefficient of the thinned filter depends upon the desired degree of specificity. Although a four-bit-per-coefficient implementation is shown for illustration, the coefficients may typically be represented by binary words having up to fourteen, or perhaps more, bits.

A filter tap weight coefficient, $a_k$, may be expressed as an N-bit number in binary form:

$$a_k = -\alpha_{k0} + \sum_{n=1}^{N-1} \alpha_{kn} 2^{-n} \quad (1)$$

where the $\alpha_{kn}$ are the bits (0, 1) that form $a_k$, $\alpha_{k0}$ is the sign bit, and $|a_k| < 1$.

Statistically, each $\alpha_{kn}$ is 0 or 1 with equal likelihood. Therefore, during any given clock interval half of the information bits are unused, to the detriment of the signal-to-noise ratio of the device. The Buttner-Schüssler form can be used to obtain bits having values of ±1.

The negative of $a_k$ is formed by complementing all bits and adding a "1" in the least significant bit (LSB) position, i.e., $$-a_k = -\overline{\alpha}_{k0} + \sum_{n=1}^{N-1} \overline{\alpha}_{kn} 2^{-n} + 2^{-(N-1)} \quad (2)$$

Now, $a_k$ can be expressed:

$$a_k = \tfrac{1}{2}[a_k - (-a_k)] \quad (3)$$

$$a_k = \tfrac{1}{2} \sum_{n=0}^{N-1} \beta_{kn} 2^{-n} \quad (4)$$

where $$\beta_{k0} = -(\alpha_{k0} - \overline{\alpha}_{k0}) \quad (5)$$

$$\beta_{kn} = (\alpha_{kn} - \overline{\alpha}_{kn}), \; n \neq 0, N-1 \quad (6)$$

$$\beta_{k, N-1} = (\alpha_{k, N-1} - \overline{\alpha}_{k, N-1}) - 1 \quad (7)$$

The coefficient $a_k$ is thus expressed by coefficients having values ±1, except for the least significant bit, which has values 0 or −2.

Each bit of the multibit filter coefficient is used as a bit-tap weight 44 on a tap from the input delay line 40. The tap weight multiplies the tap input by the value of the tap weight. In this way, each tap and its corresponding bit-tap multiplier correspond to one bit of a multibit thinned-filter coefficient. In the filter embodiment shown in FIG. 4, each tap is taken from the output of one of the input line delay elements 42. An additional control tap is taken from the input of the first delay element. Thus, the filter has N taps from a delay line having N−1 delay elements 42.

The bit multipliers or weights of the binary-coefficients 44 are preferably plus or minus one (±1). Such a binary multiplier is easy to implement and is accurate in high-frequency applications because of the ease with which an input signal can be multiplied by a unitary coefficient. In addition, the use of plus or minus one, rather than one or zero, provides a better signal-to-noise ratio in the output from the multiplier by supplying more definite outputs.

In the example shown, the first tap weight 44a, 44e of each group forming a four-bit-coefficient multiplier is representative of the least-significant bit of the four-bit word. The first tap having the first binary tap weight 44a is, in the example shown, coupled to the input to the first delay element 42a of the input delay line. The next bit-tap weight 44b is coupled to the output of the first delay element 42a or the input to the second delay element 42b. That tap weight is preferably representative of the next-least-significant bit of the thinned-filter coefficient. That construction is continued so that the Nth tap, with its Nth-bit tap weight 44d forming the most-significant bit of the N bit word forming the filter coefficient is taken from the output of the (N−1)th delay element 42c of the delay line.

For a filter having more than one multiplier coefficient expressed in binary form, the delay element, tap, and bit-multiplier-weight structure is repeated for each filter-multiplier coefficient. In the filter structure shown in FIG. 4, two multiplier coefficients are each represented by four-bit words. Thus, each coefficient is represented by four individual single-bit-weight multipliers. The bit-tap weights for each filter coefficient are preferably coupled to the delay line in the same order for each coefficient. It will be noted that the number of taps divided by the thinning factor is an integer.

Figure 4:
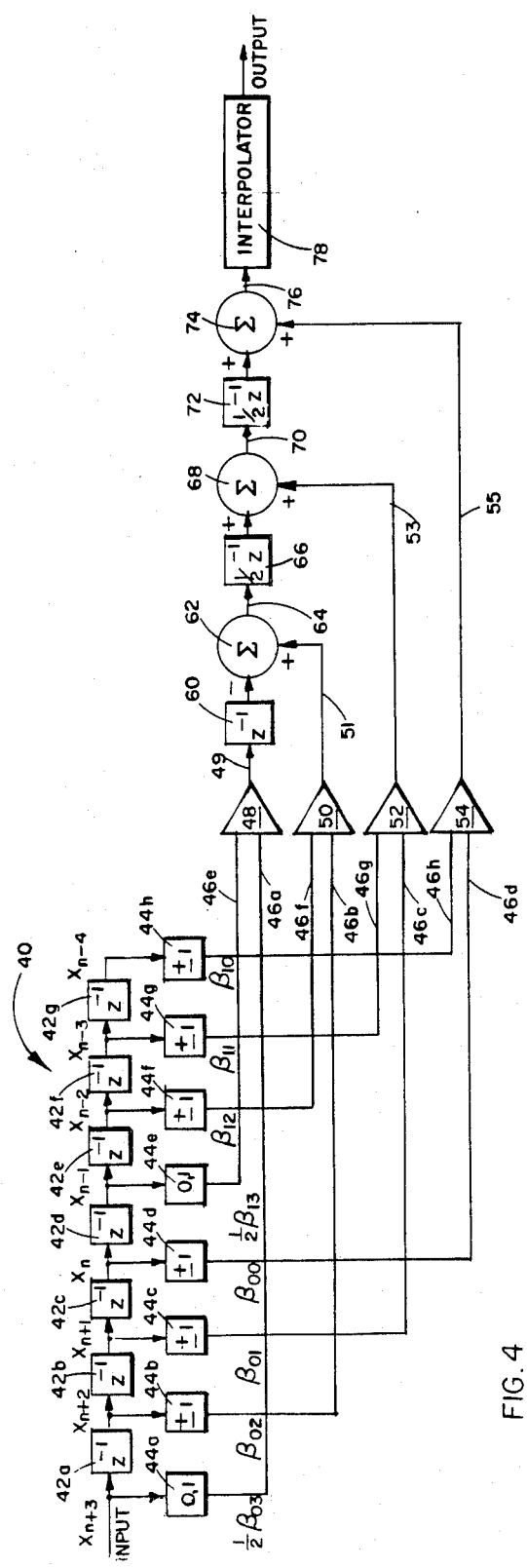
FIG. 4 is a schematic diagram of one embodiment of the hybrid filter of the invention.

At a particular time, for a signal input to the signal processor of FIG. 4, the signal at the input to the first delay element 42a and tapped by the first tap element of the first coefficient word is designated $x_{n+3}$. The input to the second delay element 42b is $x_{n+2}$; the input to the third delay element 42c is $x_{n+1}$; and the input to the fourth delay element 42d is $x_n$. The input to the fifth delay element 42e, which is tapped by the first tap element of the second coefficient word, is designated $x_{n-1}$; the input to the sixth delay element 42f is $x_{n-2}$; the input to the seventh delay element 42g is $x_{n-3}$; and the output from the seventh delay element 42g is $x_{n-4}$.

In the illustrated embodiment the first and fifth bit-factor elements 44a, 44e represent the least-significant bits of the two thinned-filter coefficients $a_0$ and $a_1$. According to the calculations above, these bit multipliers may each have a value of 0 or −2. Thus, the first coefficient is $(-\tfrac{1}{2})\beta_{03}$ and the fifth coefficient is $(-\tfrac{1}{2})\beta_{13}$. The outputs 46a, 46e of those multipliers are therefore $(-\tfrac{1}{2})\beta_{03}x_{n+3}$ and $(-\tfrac{1}{2})\beta_{13}x_{n-1}$, respectively.

The second and sixth bit-factor multipliers 44b, 44f represent the next-least-significant bits of the coefficients $a_0$ and $a_1$. Those bit multipliers have values $\beta_{02}$ and $\beta_{12}$, respectively, each of which may equal ±1. The respective outputs 46b, 46f of those multipliers are $\beta_{02}x_{n+2}$ and $\beta_{12}x_{n-2}$.

Similarly, the third and seventh bit-factor multipliers 44c, 44g represent the second-most-significant bits of their respective four-bit coefficients. Those bit multipliers have values $\beta_{01}$ and $\beta_{11}$, respectively, each of which may equal ±1. The respective outputs 46c, 46g of those multipliers are $\beta_{03}x_{n+1}$ and $\beta_{11}x_{n-3}$.

Finally, the fourth and eighth bit-factor multipliers 44d, 44h represent the most-significant bits of the two four-bit coefficients. Those multipliers have values $\beta_{00}$ and $\beta_{10}$, respectively, which are ±1. The respective outputs 46d, 46h of those multipliers are $\beta_{00}x_n$ and $\beta_{10}x_{n-4}$.

Coefficient-multiplier bits having the same significance in their respective coefficients are subsequently factored and combined to form the output, processed signal. The outputs of bit-tap weights having the same significance in each of their respective coefficients are combined in an adder that combines the outputs of the bit-tap weights having common significance in the multibit coefficient words. The outputs of all the bit-taps forming a single coefficient word are combined together to form a multibit output signal word.

The outputs from the bit multipliers representing the least-significant bits of the four-bit coefficients $a_k$ are combined in a first adder 48 to produce an analog equivalent of a least-significant-bit output 49 of:

$$\tfrac{1}{2} \sum_{k=0}^{1} \beta_{k3} x_{n-4k+3} \tag{8}$$

The outputs from the bit multipliers representing the next-least-significant bits are combined in a second adder 50 to produce an analog equivalent of a next-least-significant bit output 51 of:

$$\sum_{k=0}^{1} \beta_{k2} x_{n-4k+2} \tag{9}$$

The outputs from the bit multipliers representing the next-most-significant bits are combined in a third adder 52 to produce a next-most-significant bit output 53 of:

$$\sum_{k=0}^{1} \beta_{k1} x_{n-4k+1} \tag{10}$$

The outputs from the bit multipliers representing the most-significant bits are combined in a fourth adder 54 to produce an analog equivalent of a most-significant bit output 55 of:

$$\sum_{k=0}^{1} \beta_{k0} x_{n+4k} \tag{11}$$

Because the inputs to the bit-tap weights 44 for the different bits of a single filter coefficient are delayed different amounts in the input delay line 40 prior to being tapped off and multiplied by the bit-tap weights, the outputs of the taps must be properly delayed before combination to ensure that all the output bits associated with a single multibit coefficient-multiplier word are combined together at the correct time to produce an output that is the same as would be obtained if the input had been directed through a single coefficient multiplier having a value equal to the value represented by the multibit word of the bit-tap weights.

The next-least-significant bit output 51 from the second and sixth bit-factor multipliers is one unit of time delayed with respect to the least-significant bit output 49 from the first and fifth bit-factor multipliers because of the first delay element 42a on the input delay line. Therefore, the least-significant-bit output 49 should be delayed one unit of time in a first tap-output delay element 60 prior to combination in a first summer 62 with the next-least-significant-bit output 51.

The bit-tap-weight outputs should also be appropriately weighted prior to combination in the summer to maintain the proper relative significance of the different tap outputs in the combined result. But, in the illustrated embodiment the least-significant-bit multipliers 44a, 44e have as factor of ½ built in, so no additional weighting is necessary prior to combining the least-significant and next-least-significant-bit outputs 49, 51. Because of the sign attached to the bit factors $\beta_{03}$ and $\beta_{13}$, the least-significant-bit output 49 is input as a negative into the first output summer 62.

The output 64 from the first output summer 62 is a signal representative of the least-significant and next-least-significant bits of the tap-weight output.

The combined output 53 from the third and seventh bit multipliers 44c, 44g are one unit of time delayed with respect to the output from the second and sixth multipliers 44b, 44f, and hence are also one unit of time delayed from the output 64 from the first output summer representing the least-significant and next-least significant bits of the tap-weight output. Therefore, the combined output 64 from the first output summer is delayed in a second output delay element 66 before being combined with the outputs 53 from the third and seventh bit multipliers. Also, since the output from the third and seventh bit multipliers is to have greater significance in the final output than the output from the first output summer, the output 64 from the first output summer is scaled by ½ before being combined with the output of the third and seventh bit multipliers in a second output summer 68.

Similarly, the output 70 of the second output summer 68 is scaled by ½ and delayed one unit of time in a third output-delay element 72 before being combined in a third output summer 74 with the combined output 55 of the fourth and eighth bit-tap weight multipliers. The resulting signal on the summer output 76 is represented by:

$$\sum_{k=0}^{1} (\beta_{k0} + (\tfrac{1}{2})\beta_{k1} + (\tfrac{1}{4})\beta_{k2} + (\tfrac{1}{8}) \beta_{k3}) x_{n-4k} \tag{12}$$

Referring back to Equation 4, we see this is:

$$2 \sum_{k=0}^{1} a_k x_{n-4k} \tag{13}$$

Thus, the signal processor constructed as described and shown has a gain factor of 2 built into it.

After combination, an interpolator 78 acts on the output 76 to fill in the missing parts of the signal lost due to dropping some of the coefficients and to restore the output signal. Such interpolators are known in the art in connection with conventional analog thinned or decimated FIR filters. Such interpolation restores the missing points on the impulse curve with adequate accuracy, as discussed in the articles previously referred to. In some applications, it has been found that interpolation as simple as a straight line yields acceptable results.

Because of the simplicity of changing the bit-tap weights for the binary-coefficient multipliers in the filter of the invention, it is easy to change the coefficient multipliers in the filter just described. In addition, because of the binary nature of each bit-tap weight, the coefficient multipliers may be changed accurately and quickly, without the need for a great deal of adjustment to obtain accurate analog-filter coefficients. In addition, the binary-coefficients of each bit-tap weight allow accurate, high-speed multiplication of high-frequency input signals.

COMPARATIVE ANALYSIS

Figure 1:
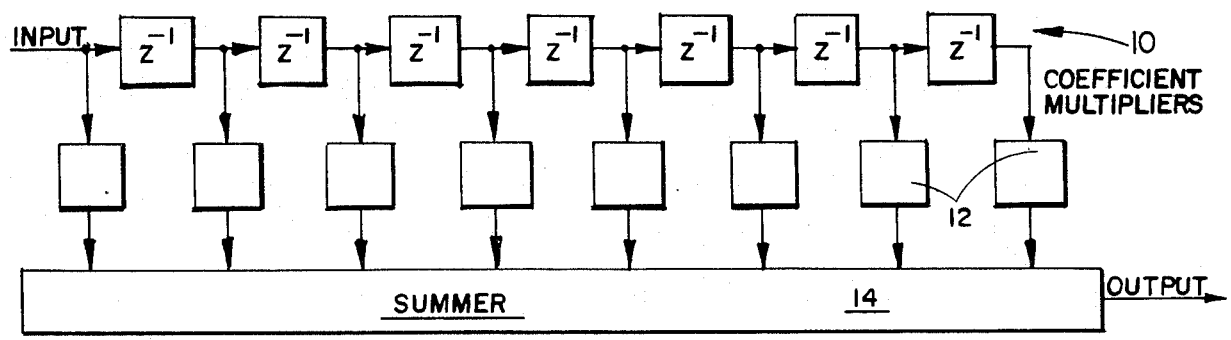
FIG. 1 is a schematic diagram of a conventional analog finite-impulse-response filter of the prior art.
Figure 2:
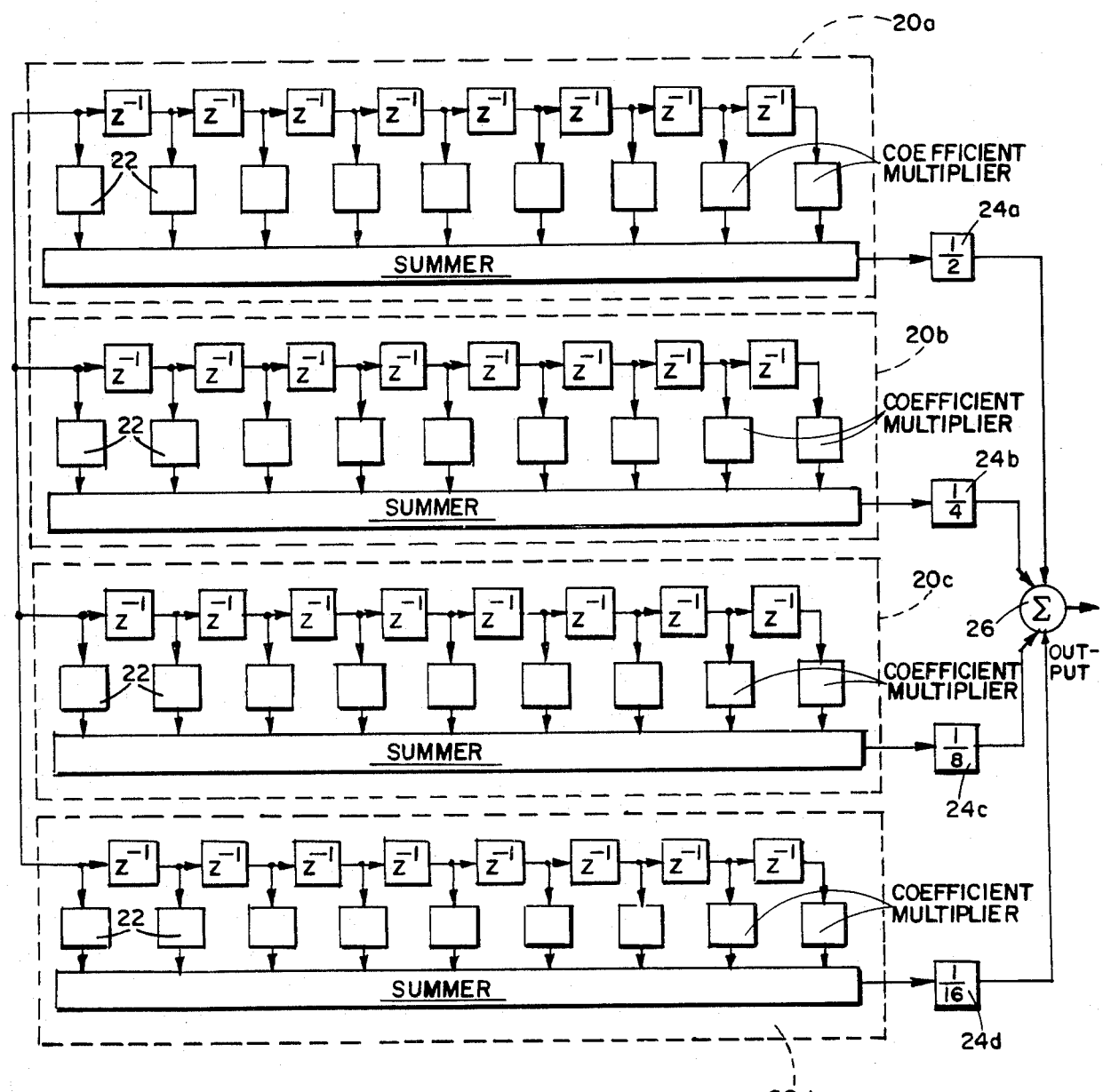
FIG. 2 is a schematic diagram of a finite-impulse-response filter using binary-analog correlators.

Many of the advantages of the present invention can be appreciated by comparing the performance of the filter using a plurality of parallel binary-analog correlators as shown in FIG. 2 with the embodiment of the invention shown in FIG. 4.

Figure 5:
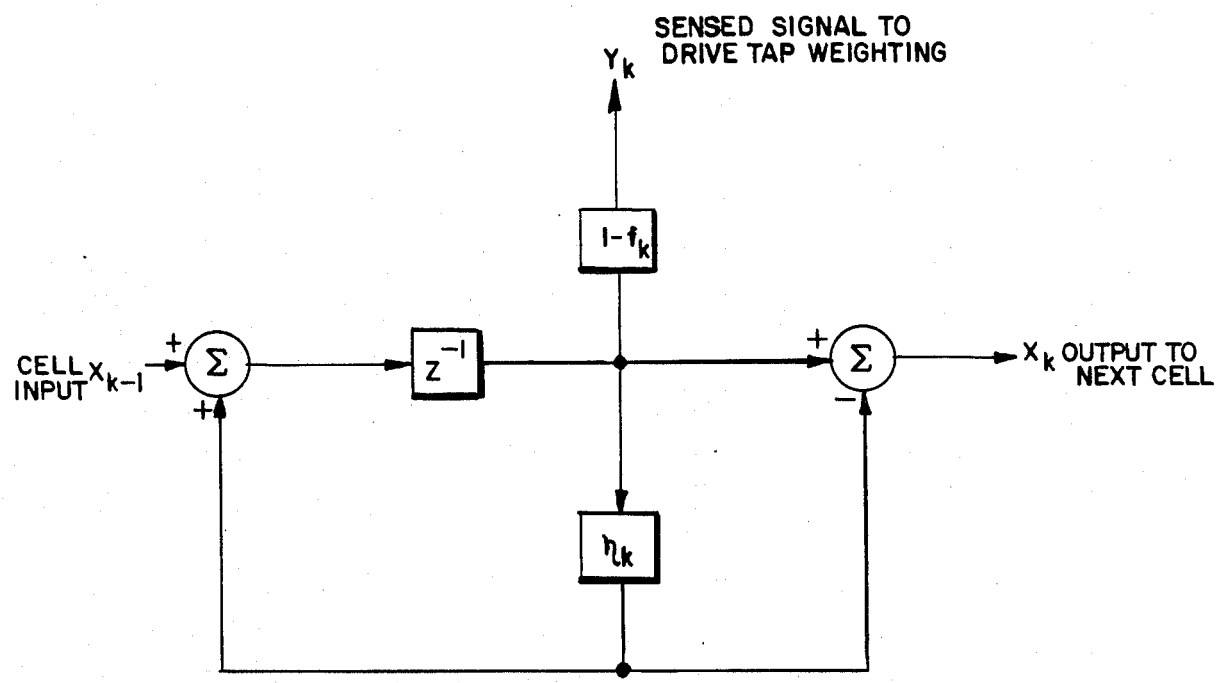
FIG. 5 is a model of a CCD cell for use in modeling a filter.

FIG. 5 illustrates a model of the kth CCD cell in a string of CCD cells as part of the input-delay line. The input from the previous delay-element cell is $x_{k-1}$, and the output to the succeeding cell is $x_k$. Because of feedback and charge-transfer inefficiency (CTI, $\eta$), the delay element does not operate as an ideal element, but operates essentially in accordance with the model illustrated in FIG. 5. The sensed output from the delay element $y_k$ is input to the tap weight coupled to that delay element.

It has been found that the effective tap weight coupled to each sensed output is composed of a weighted sum of the actual tap weight and the preceding tap weight. Consequently, charge-transfer inefficiency results at each cell.

In the binary-analog-correlator filter, the transfer function of each correlator is a function of a number of factors. An actual transfer function differs from the theoretical ideal transfer function, leaving an error transfer function as the difference between the actual and ideal transfer functions.

Each tap element has its own charge-transfer inefficiency $\eta$. The CTI, $\eta$, of the various taps are not likely to be identical, so an inconsistency $\Delta\eta$ of charge-transfer inefficiencies exists. That inconsistency contributes to filter "leaks". Noise also arises as fixed-pattern noise (FPN) due to inaccuracies in reading out the charge from each well of the transfer device.

Figure 6:
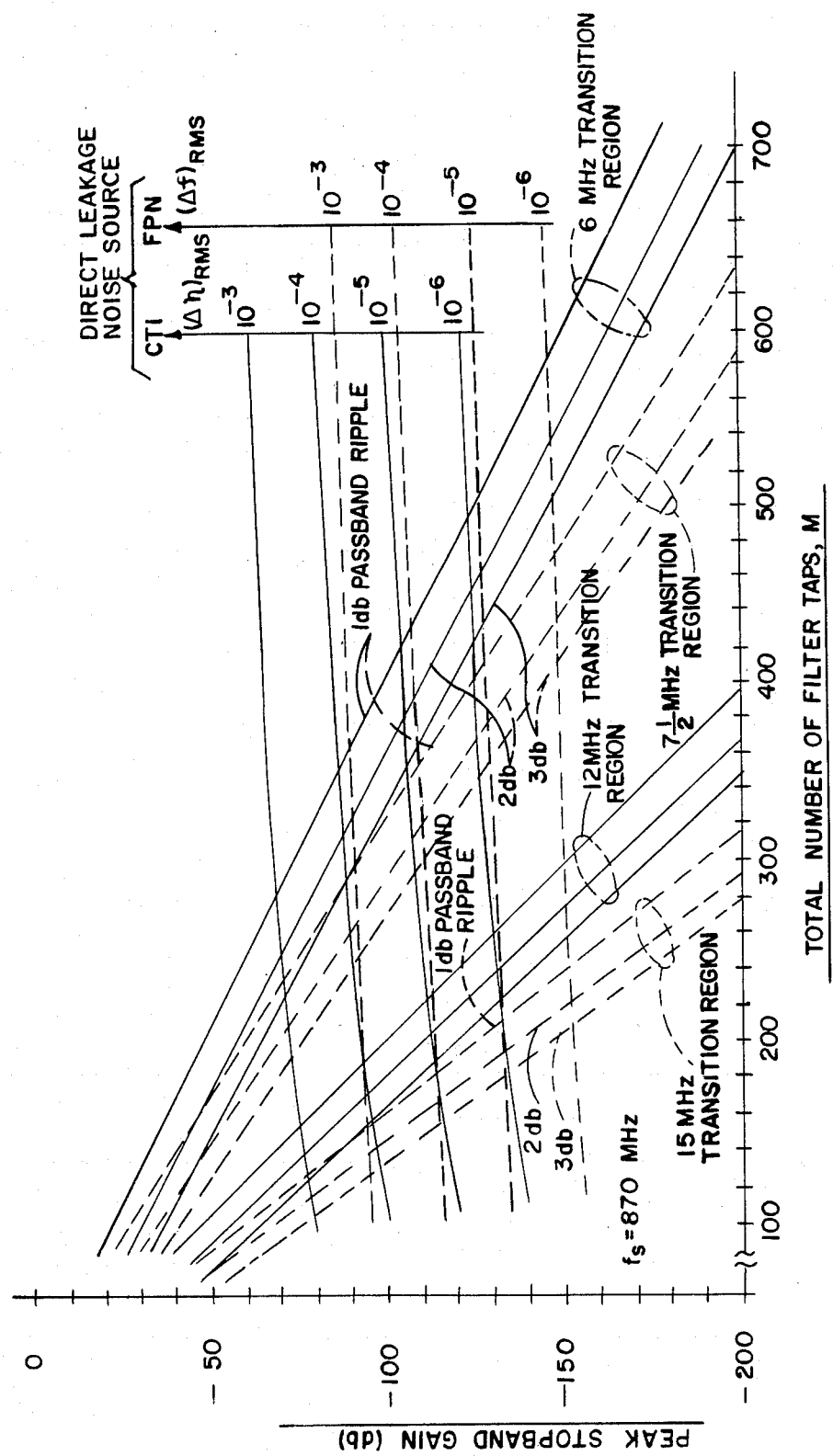
FIG. 6 is a graph illustrating filter leakage for various values of fixed-pattern noise (FPN), and charge-transfer inefficiency (CTI), superimposed upon a parametric plot of FIR filter parameters that relate the number of taps, the transition width, the passband ripple, and the peak stopband gain for the agile bandpass filter.

FIG. 6 illustrates the filter leaks for various fixed pattern noise ($\Delta f$) and charge-transfer inefficiency (CTI) inconsistencies $\Delta\eta$ superimposed upon a parametric plot of finite-impulse-response filter parameters that relate the number of taps, the transition width, the passband ripple, and peak stopband gain for the agile bandpass filter.

Figure 7:
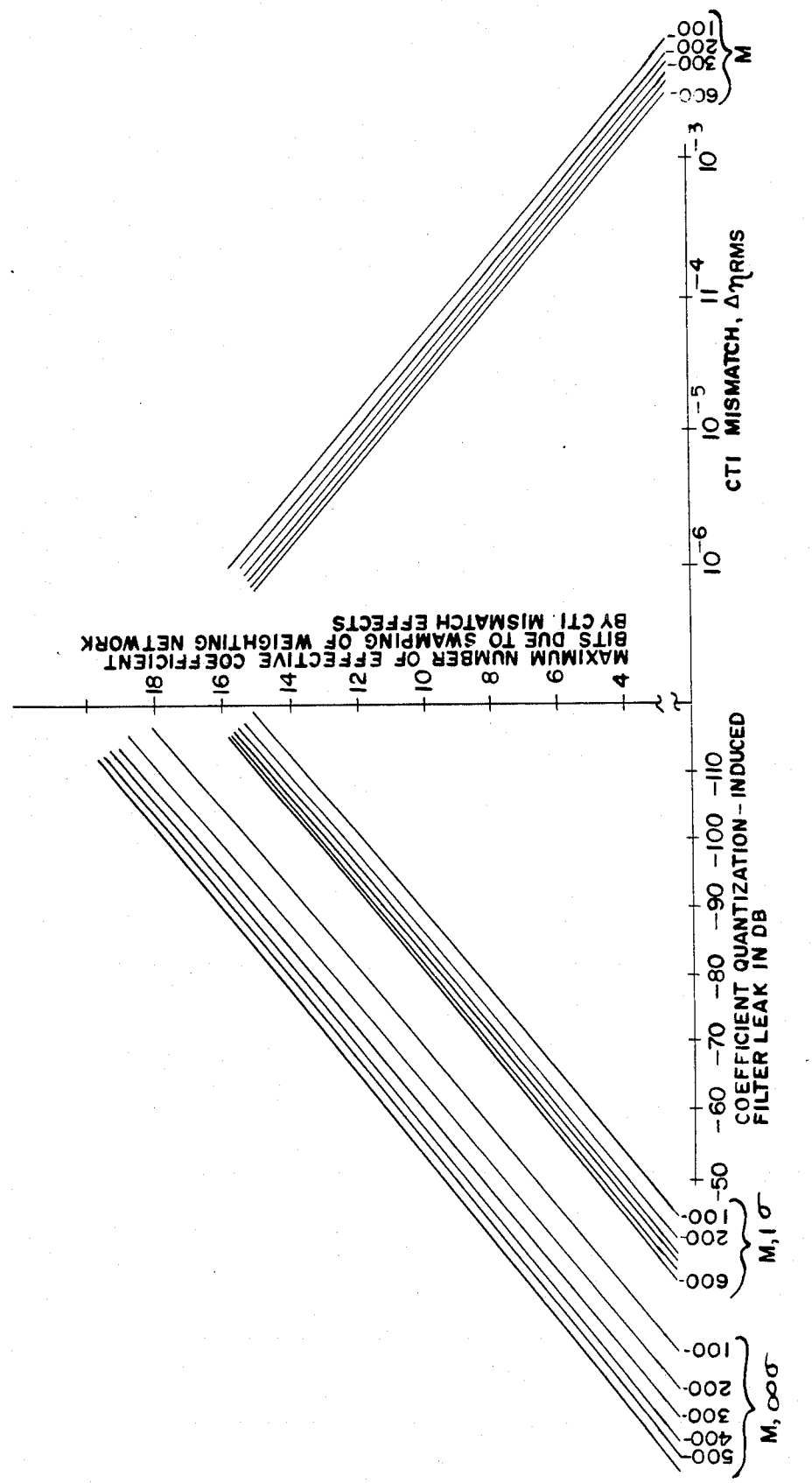
FIG. 7 is a graph illustrating the effects of frequency-dependent-weighting errors due to charge-transfer inefficiency mismatch.

Weighting errors cause another independent filter leak, the effect of which is shown in FIG. 7. The curves illustrated in the left half of the graph of FIG. 7 can be converted to represent the curves for other values of $\sigma$. To convert the 1 $\sigma$ curves to 2 $\sigma$ or 4 $\sigma$ curves, the 1 $\sigma$ curves are shifted one bit or two bits, respectively. To remain accurate, the filter should maintain the frequency-dependent weighting error less than $\frac{1}{2}$ the value of the least-significant bit.

Figure 8:
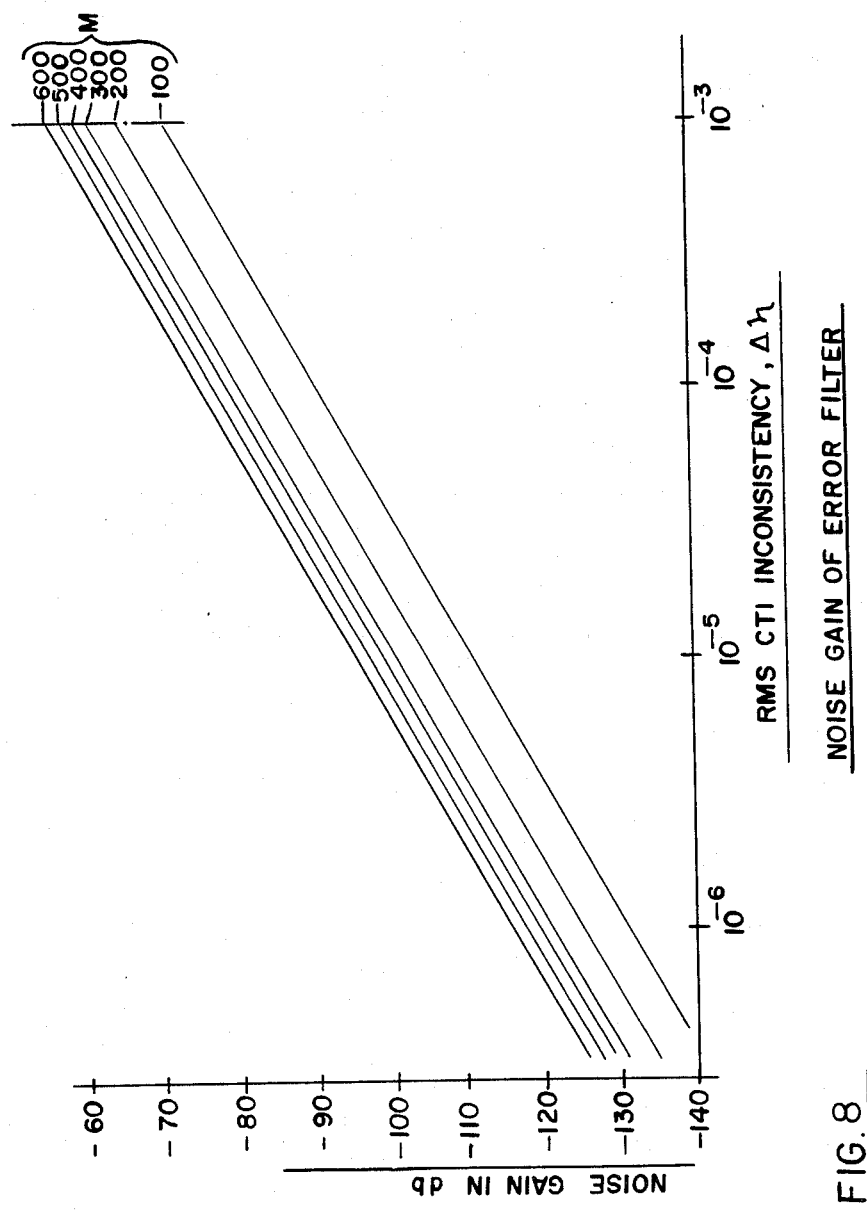
FIG. 8 is a graph illustrating noise gain as a function of charge-transfer-inefficiency mismatch.

Noise gain then becomes a function related to the log of the square of the charge-transfer-inefficiency inconsistency, which is the difference among the charge-transfer inefficiencies of the various delay elements of the correlator. The total noise gain for the correlator-filter output is plotted in FIG. 8. The number M represents the number of tap weights.

Using the embodiment of the invention shown in FIG. 4, the number of delay elements and taps is substantially reduced from that of the binary-analog-correlator filter shown in FIG. 2. As a result, the filter will tolerate a larger inconsistency or mismatch among the charge-transfer inefficiencies of the various delay lines or delay elements and still maintain acceptable overall performance. This can be seen from FIG. 8, in which it is seen that the fewer the number of taps, the lower the noise gain for a given charge-transfer-inefficiency inconsistency.

This analysis and conclusion are based upon White, "Apparent Performance Limit of a Binary-Analog Correlator (BAC) CCD Filter," *Proc.* 1983 *IEEE International Symposium on Circuits and Systems,* Newport Beach, CA; May 24, 1983; pp. 1354–1357.

I claim:
1. A signal processor comprising:
a signal input;
a signal output;
a delay line having at least a first and second tap, said first tap being coupled to said signal processor signal input, said delay line having a series of coupled delay elements, each delay element having an input and an output, the output of each successive delay element being coupled to the input of the next successive delay element in said delay line; said delay line having a first delay element having an input coupled to said signal processor signal input;
said input delay line having said delay elements grouped into at least two delay line segments, each delay line segment having at least a first and last delay element, each delay line segment defining a space from one tap location up to, but not including, the next tap location of a thinned FIR filter as fair space to define the value of a filter coefficient for the respective tap;
at least two groups of bit-tap multiplier elements, each group of bit-tap multiplier elements corresponding to a delay line segment, each group of bit-tap multiplier elements having a corresponding bit-tap multiplier for each delay element within a delay line segment, each successive bit-tap multiplier within a group of bit-tap elements having an input coupled to the input of a respective delay line segment delay element input, each bit-tap multiplier element multiplying the input signal value to a respective delay element by a single binary bit of a multibit word comprising the filter coefficient of a thinned FIR filter;
a summer for combining the outputs of said bit-tap multiplier elements;
a plurality of delay elements coupled to the outputs of at least some of said bit-tap elements for delaying those bit tap outputs, the outputs and delayed outputs of said multiplied bit-tap elements being combined together in said summer to form a single processor output signal, said signal processor output signal being coupled to said signal processor signal output.

2. The signal processor of claim 1, said signal processor further comprising:
an array of adders equal in number to the number of delay elements in a delay line segment, each adder having an input for each group, and an output, the inputs to each adder being coupled to the outputs of respective bit-tap multiplier elements in successive groups, each adder combining the signal values of the outputs of respective bit-tap multiplier elements to provide a combined output, at the output of each adder;
said plurality of delay elements being coupled to the outputs of at least some of said adders for delaying those combined outputs to form delayed combined outputs, the combined outputs and delayed combined outputs of said adders being combined together in said summer to form said signal processor output signal; and,
at least one scaling-multiplier element, each scaling-multiplier element being coupled serially between the output of one of said adders and said summer for multiplying said combined output by a factor representative of the significance of the bit weight of the bit-tap element in the filter coefficient, prior to combination in said summer.

3. The signal processor of claim 2 wherein each of said scaling-multiplier elements is coupled in series with one of said delay elements.

4. A signal processor comprising:
   a signal input;
   a taped delay line having at least two taps, each tap being followed by an equal number of delay elements, the delay elements following one tap location and the next defining a space from one tap location up to, but not including, the next tap location of a thinned FIR filter as fair space to define the value of a filter coefficient for the respective tap;
   at least two groups of bit tap elements, each group of bit tap elements corresponding to a successive tap location, each bit-tap element within a group having an input and an output, the input of each bit-tap element being coupled to the input of a corresponding delay element within the defined space for the tap;
   each bit-tap element being characterized to multiply the signal at its input by a single binary bit of a multibit word characterizing the filter coefficient of said tap;
   a bank of adders for combining the outputs of respective bit-tap elements within successive groups of bit-tap elements to form a combined output at the output of each adder;
   at least one summer for combining the combined outputs of said adders;
   a plurality of delay elements coupled to the outputs of at least some of said adders, the combined outputs of respective bit-tap elements of each filter coefficient being combined together in said summer to form a signal processor output signal; said signal processor output signal being coupled to a signal processor output.

5. The signal processor of claim 4 additionally comprising
   at least one scaling-multiplier element, each scaling-multiplier element being coupled serially between the output of one of said adders and said summer for multiplying said combined output by a factor representative of the significance of the bit weight of the bit-tap element in the filter coefficient, prior to combination in said summer.

6. The signal processor of claim 4 wherein at least some of said factor-multiplier elements each additionally comprises a delay element.

7. A signal processor comprising:
   a signal input;
   a delay line coupled to said signal input and comprising a plurality of first delay elements connected in series;
   a plurality of bit-tap elements, wherein:
     each bit-tap element has an input and an output;
     the input of each bit-tap element being coupled to the input of a different one of said first delay elements, said input delay line having said delay elements grouped into at least two delay line segments, each delay line segment having at least a first and last delay element, each delay line segment defining a space from one tap location up to, but not including, the next tap location of a thinned FIR filter as fair space to define the value of a filter coefficient for the respective tap; and
     each bit-tap element multiplies its input by a single bit weight corresponding to a bit of an L-bit filter coefficient of a thinned finite-impulse-response filter thereby spreading the weighted binary or ternary representation of each filter coefficient across L delay-element outputs;
   a plurality of factor elements coupled to the outputs of said bit-tap elements for multiplying said bit-tap-element outputs by factors representative of the significance of the bit in said filter coefficients corresponding to the single-bit weights of said bit-tap elements;
   a plurality of summers coupled to the outputs of said factor elements, for combining said outputs;
   a plurality of delay elements, each coupled to an input of a different one of said summers for delaying signals processed by said summers; and
   a signal output connected to the output of one of said summers.

8. A signal processor comprising:
   a signal input;
   a delay line coupled to said signal input, and comprising a first set of $(N-1)+(L-1)$ delay elements connected in series, the ratio of $N/L$ being an integer;
   a set of $N+L-1$ tap elements wherein:
     each tap element has an input and an output;
     $(N-1)+(L-1)$ of said $N+L-1$ tap elements are each coupled to the input of a corresponding one of said $(N-1)+(L-1)$ delay elements so that the first tap element has its input coupled to the input of the first delay element, the second tap element has its input coupled to the input of the second delay element, and the $(N-1)+(L-1)$th tap element has its input coupled the input of the $(N-1)+(L-1)$th delay element;
     the $N+(L-1)$th tap element has its input coupled to the output of the $(n-1)+(L-1)$th delay element; and
   each tap element multiplies its input by a single bit weight corresponding to a bit of a filter coefficient of a thinned finite-impulse-response filter having one coefficient for every L delay elements thereby spreading the weighted binary or ternary representation of each filter coefficient across L delay-element outputs;
   a set of $(N-1)+(L-1)$ summers coupled in series with the outputs of said tap elements wherein each summer combines the output of one of said tap elements with the delayed combined output of other tap elements, wherein:
     each summer has a pair of inputs;
     one input of each summer, except the first summer, is coupled to the output of an adjacent summer;
     one input of the first summer is coupled to the output of one of said tap elements; and
     the other input of each summer is coupled to the output of one of said tap elements; and
   a second set of $(N-1)+(L-1)$ delay elements, wherein:
     each of said second delay elements, except the first delay element, is coupled between adjacent summers;
     the first delay element of said second set is coupled to the input of the first summer;
   a set of factor elements, each coupled to the input of a different one of said summers for weighting said input to an appropriate magnitude relative to the other input of said summer; and an interpolator coupled to the output of said Nth summer; and a signal output coupled to the output of said interpolator.

9. A method of processing a signal comprising:

delaying an input signal $N+(L-1)$ times by processing it through a series of $N+(L-1)$ delay elements, the ratio of N/L being an integer;

tapping the input of each delay element and the output of the $N+(L-1)$th delay element to produce $N+L$ tap outputs;

multiplying each tapped signal by a tap coefficient comprising a part of an L-bit filter coefficient of a thinned finite-impulse-response filter having one coefficient for every L delay elements thereby spreading the weighted binary or ternary representation of each filter coefficient across L delay-element outputs to produce $N+L$ multiplier outputs;

delaying the first multiplier output;

combining the delayed first multiplier output with the second multiplier output to produce a first sum;

delaying said first sum;

combining said delayed first sum with a third multiplier output to produce a second sum;

delaying said second sum; and continuing to combine each multiplier output with the delayed sum of the previous multiplier outputs; and outputting one of said multiplier outputs as an output signal.

10. The method of claim 9 additionally comprising multiplying each multiplier output by a factor representative of the significance of the part of the multibit filter coefficient represented by the tap coefficient of that multiplier.

* * * * *

UNITED STATES PATENT AND TRADEMARK OFFICE
CERTIFICATE OF CORRECTION

PATENT NO. : 4,809,209
DATED : February 28, 1989
INVENTOR(S) : Stanley A. White

It is certified that error appears in the above-identified patent and that said Letters Patent is hereby corrected as shown below:

On the Title page, and again in Col. 1, line 2, please correct the spelling of the word "MYBRID" to read "HYBRID".

Signed and Sealed this

Twenty-fifth Day of July, 1989

Attest:

DONALD J. QUIGG

Attesting Officer

Commissioner of Patents and Trademarks